United States Patent

Han et al.

[11] Patent Number: 6,013,549
[45] Date of Patent: Jan. 11, 2000

[54] DRAM CELL CAPACITOR AND METHOD FOR MANUFACTURING THE SAME

[75] Inventors: Min-Seog Han, Kyunggi-do; Ji-Chul Shin, Seoul; Seok Woo Nam, Seoul; Hyung-Seok Lee, Seoul, all of Rep. of Korea

[73] Assignee: Samsung Electronics Co., Ltd., Suwon, Rep. of Korea

[21] Appl. No.: 09/148,633

[22] Filed: Sep. 4, 1998

[30] Foreign Application Priority Data

Sep. 4, 1997 [KR] Rep. of Korea ............ 97-45859

[51] Int. Cl.[7] ............................. H01L 21/8242
[52] U.S. Cl. ............ 438/253; 438/255; 438/396; 438/398
[58] Field of Search ................. 438/253, 254, 438/255, 396, 397, 398

[56] References Cited

U.S. PATENT DOCUMENTS 5,733,820  3/1998  Adachi et al. ................... 438/719
5,851,877  12/1998  Ho et al. ....................... 438/253
5,858,834  1/1999  Hirota et al. .................. 438/253

*Primary Examiner*—Brian Dutton
*Assistant Examiner*—Toniae M Thomas
*Attorney, Agent, or Firm*—Jones Volentine, LLP

[57] ABSTRACT

A DRAM cell capacitor is provided wherein a capacitor bottom electrode has an HSG (Hemi-Spherical Grain) layer formed thereon so as to increase capacitance of the capacitor. In the DRAM cell capacitor, the capacitor bottom electrode has an angled shape at a top edge thereof, and the HSG silicon layer is not formed on the top edge of the capacitor bottom electrode. A method for manufacturing the DRAM cell capacitor comprises etching an upper portion of the conductive layer using the photoresist pattern as a mask, and at the same time forming a polymer on both sidewalls of the photoresist pattern to etch the upper portion thereof and thereby to make a top edge of the conductive layer be angled. The method further comprises etching a remaining portion of the conductive layer sing a combination of the photoresist pattern and the polymer as a mask until an upper surface of the interlayer insulating layer is exposed, to thereby form the capacitor bottom electrode.

15 Claims, 10 Drawing Sheets

DRAM CELL CAPACITOR AND METHOD FOR MANUFACTURING THE SAME

FIELD OF THE INVENTION

The present invention relates to a DRAM cell capacitor and a method for manufacturing the same that is capable of increasing capacitance thereof by forming HSG (Hemi-Spherical Grain) on a surface of a storage electrode.

BACKGROUND OF THE INVENTION

Tatsumi discloses a conventional DRAM cell capacitor and manufacturing method in U.S. Pat. No. 5,385,863 issued Jan. 31, 1995, entitled "METHOD OF MANUFACTURING POLYSILICON FILM INCLUDING RECRYSTALLIZATION OF AN AMORPHOUS FILM." As shown in this application HSG silicon is grown on a capacitor storage electrode of simple staked structure.

FIG. 1 shows a conventional art DRAM cell capacitor. Referring to FIG. 1, a conventional art DRAM cell capacitor has a semiconductor substrate 10 whose active and inactive regions are defined by a field oxide layer 12. A pad electrode 14 is formed on the active region of the substrate 10. An interlayer insulating layer 16 is then formed over the field oxide layer 12 including the pad electrode 14. A contact hole 19 is formed through the interlayer insulating layer 16 to an upper surface of the pad electrode 14. A conductive layer is then deposited over the interlayer insulating layer 16 to fill up the contact hole 19, and is then patterned to form a capacitor storage electrode 20. As the storage electrode 20 is formed it's upper surface is perpendicular to each of its sidewalls.

Next, an HSG silicon layer 22 is formed on the capacitor storage electrode 20 so as to increase an effective surface area. Subsequently, so as to accomplish fabrication of the DRAM cell capacitor, the process steps for sequentially forming a dielectric layer and a capacitor top electrode on the capacitor storage electrode should be followed.

Prior to forming the dielectric layer (not shown) on the capacitor storage electrode, a wet etching and washing process should be performed to remove a part of the interlayer insulating layer 16 and to wash the substrate. Generally, the etching process of the interlayer insulating layer 20 uses an etchant that includes a mixture of $NH_4F$ and HF (which is called a "Lal solution" in the art), and a mixture of $NH_3$, $H_2O_2$ and deionized water (which is called an "sc1 solution" in the arts). The washing process uses an etchant that is a mixture of the sc1 solution and HF.

During the etching process using sc1 solution, a part of the HSG silicon layer 22 that is formed on the capacitor storage electrode 20, particularly, on the top edges thereof is apt to be lifted. When this happens, adjacent capacitor storage electrodes may be electrically connected (i.e., short-circuited) with each other by the lifted HSG silicon.

The short-circuit occurring by the lifted HSG between the storage electrodes is shown in FIGS. 2A to 2C. FIG. 2A shows a scanning electron microphotograph (SEM) that illustrates a plan view of the conventional DRAM cell capacitor array, FIG. 2B shows a SEM that illustrates a perspective view of the conventional DRAM cell capacitor array shown in FIG. 2A. FIG. 2C is an enlarged perspective view of the two adjacent DRAM cell capacitors which are indicated by a dotted circle in FIG. 2B.

As is apparent from FIGS. 2A to 2C, after the formation of capacitor storage electrodes, a short-circuit between the capacitor storage electrodes is generated due to an HSG silicon tab 24, which is lifted from the top edges of the respective capacitor storage electrodes. This leads to the failure of DRAM devices.

Lifting the HSG silicon from the storage electrode is caused by the following two reasons: (1.) HSG silicon which is abnormally grown due to the remaining polymers is apt to be lifted during the etching process of the storage electrode. (2.) HSG silicon which is grown at, particularly, the top edges of the storage electrode is apt to be lifted by the following etching and washing process.

Thus, the present invention relates to a method for manufacturing a DRAM cell capacitor wherein HSG silicon is not formed at the top edges of a storage electrode.

SUMMARY OF THE INVENTION

It is therefore an object of the present invention to provide a DRAM cell capacitor that prevents HSG silicon from being formed at the top edges of a storage electrode, and thereby prevents a short-circuit from occurring between storage electrodes due to HSG silicon being lifted from the top edges of the storage electrode, and a method for manufacturing the same.

According to one aspect of the present invention, a DRAM cell capacitor comprises a pad electrode formed over a semiconductor substrate, an interlayer insulating layer formed over the pad electrode, a capacitor bottom electrode formed over the interlayer insulating layer and electrically connected through the interlayer insulating layer to the pad electrode, and an HSG silicon layer formed on a surface of the capacitor bottom electrode. The capacitor bottom electrode has one or more side walls, a top surface, and a top edge formed between the one or more side walls and the top surface and having an angled shape, and the HSG silicon layer is formed only on the top surface and the one or more sidewalls.

The top edge of the capacitor bottom electrode is preferably formed having either a slanted shape or a rounded shape. The bit line may be formed within the interlayer insulating layer.

According to the other aspect of the present invention, a method for manufacturing the DRAM cell capacitor includes the steps of forming a field oxide layer over a semiconductor substrate to define active and inactive regions, forming a pad electrode over the active region, forming an interlayer insulating layer over the pad electrode and the field oxide layer, forming a contact hole in the interlayer insulating layer to expose the pad electrode, forming a conductive layer over interlayer insulating layer and filling up the contact hole, forming a photoresist pattern over the conductive layer to define a capacitor bottom electrode, simultaneously etching an upper portion of the conductive layer using the photoresist pattern as a mask, and forming a polymer on sidewalls of the photoresist pattern to etch the upper portion of the conductive layer and to thereby angle a top edge of the conductive layer, etching a remaining portion of the conductive layer using a combination of the photoresist pattern and the polymer as a mask until an upper surface of the interlayer insulating layer is exposed, to thereby form the capacitor bottom electrode having a top surface, one or more sidewalls, and the top edge formed between the top surface and the one or more sidewalls, removing the photoresist pattern and the polymer, forming an HSG silicon layer on the capacitor bottom electrode in order that the capacitor bottom electrode has a rugged surface, wherein the HSG silicon layer is formed only on the top surface and the one or more sidewalls of the capacitor bottom electrode, forming a capacitor dielectric layer over the capacitor bottom electrode, and forming a capacitor top electrode over the capacitor dielectric layer.

The top edge of the conductive layer is preferably formed to have either a slated shape or a rounded shape. The conductive layer preferably has a thickness of about 9000 Å, and the upper portion of the conductive layer has a thickness in the range of 50 Å to 200 Å. The step of etching the upper portion of the conductive layer preferably uses a mixture of $CHF_3$ and Ar gases as an enchant, while the step of etching the remaining portion of the conductive layer preferably uses a material selected from a group consisting of a mixture of $Cl_2$, $SF_6$, and $N_2$ gases, and a mixture of HBr and $Cl_2$ gases.

The method may further comprise the steps of etching an upper portion of the interlayer insulating layer so as to expose a lower surface of the conductive layer, and washing the semiconductor substrate. The step of etching the upper portion of the interlayer insulating layer may use a washing liquid that includes a mixture of $NH_4F$ and HF, and a mixture of $NH_3$, $H_2O_2$, and deionized water, or it may use a washing liquid that includes a mixture of $NH_4F$ and HF.

The step of washing the semiconductor substrate may use a washing liquid that includes a mixture of $NH_3$, $H_2O_2$, deionized water and HF solution, o rit may use a washing liquid that includes an HF solution.

The method may further comprises the step, performed after the step of forming the HSG silicon layer, of washing the semiconductor substrate using a washing liquid including a fluorine solution, and the washing liquid is preferably an HF solution.

The step of forming a contact hole may be performed by selectively etching the interlayer insulating layer to expose the pad electrode. Also, a bit line may be formed within the interlayer insulating layer.

BRIEF DESCRIPTION OF THE DRAWINGS

This invention may be understood and its objects will become apparent to those skilled in the art by reference to the accompanying drawings as follows.

DETAILED DESCRIPTION OF PREFERRED EMBODIMENTS

Figure 1:
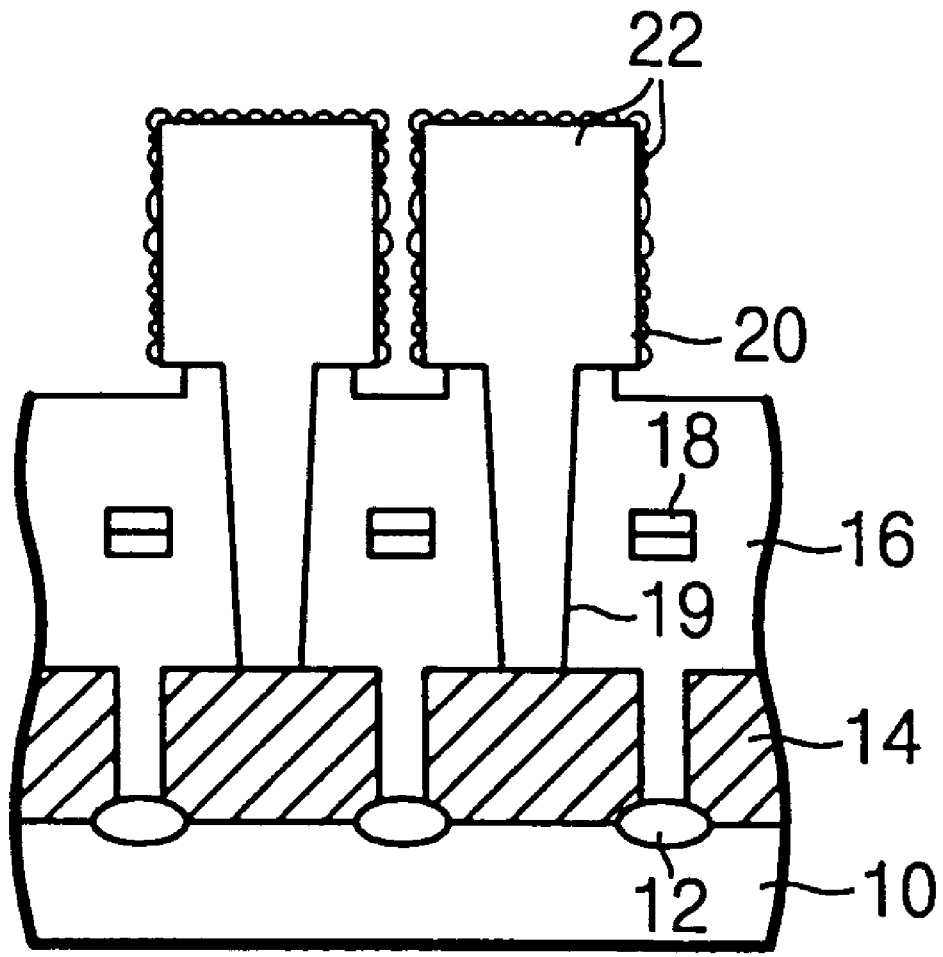
FIG. 1 is a cross-sectional view of a conventional DRAM cell capacitor.
Figure 2A:
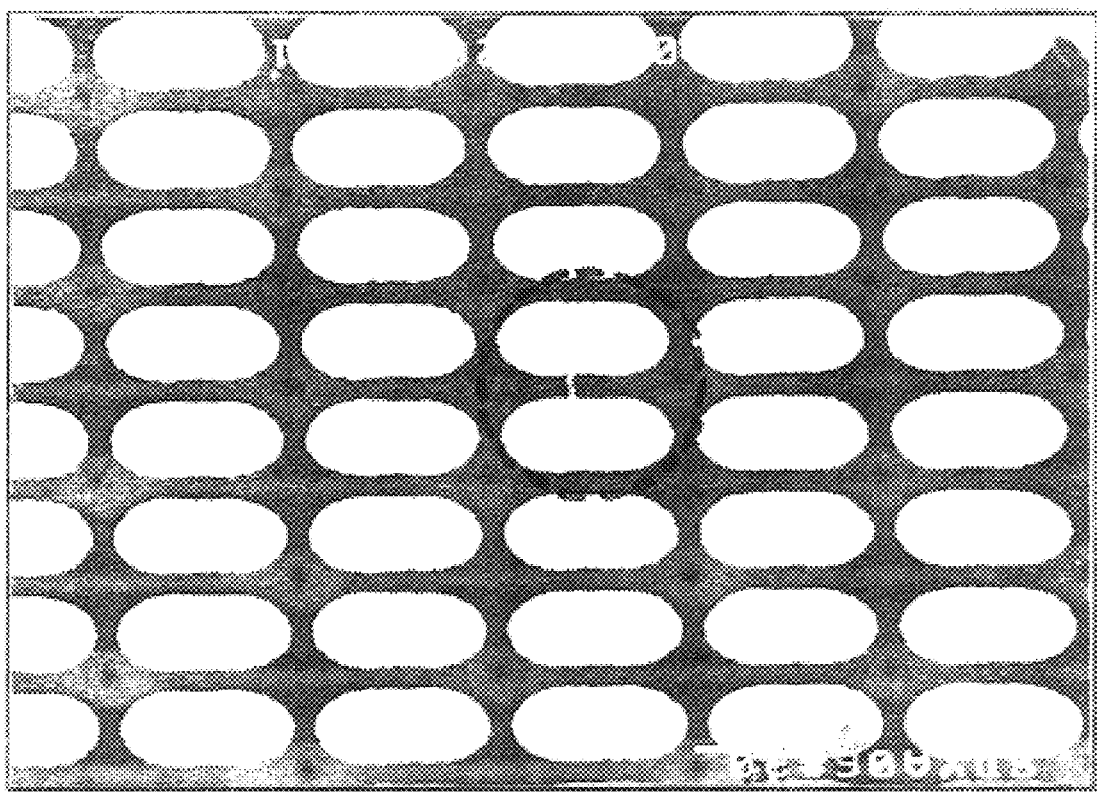
FIG. 2A is a scanning electron microphotograph (SEM) that illustrates a plan view of the conventional DRAM cell capacitor array.
Figure 2B:
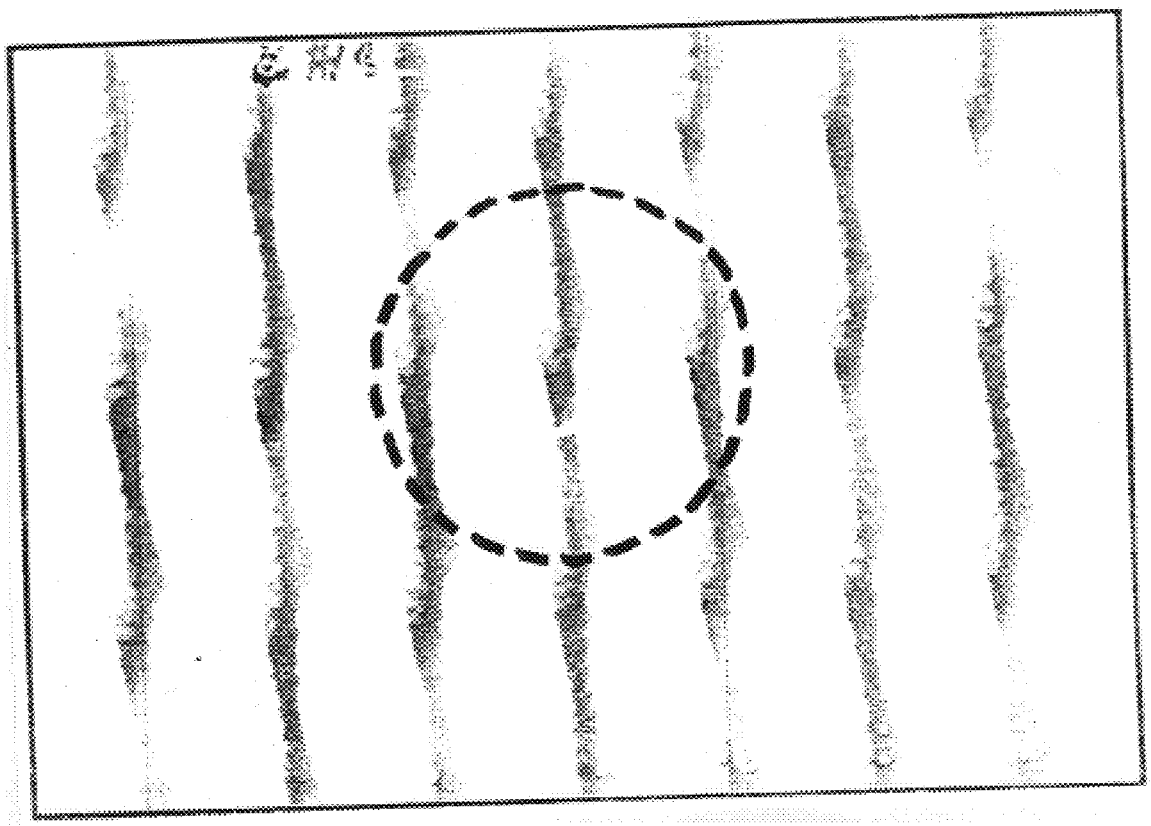
FIG. 2B is a SEM that illustrates a perspective view of the conventional DRAM cell capacitor array shown in FIG. 2A.
Figure 2C:
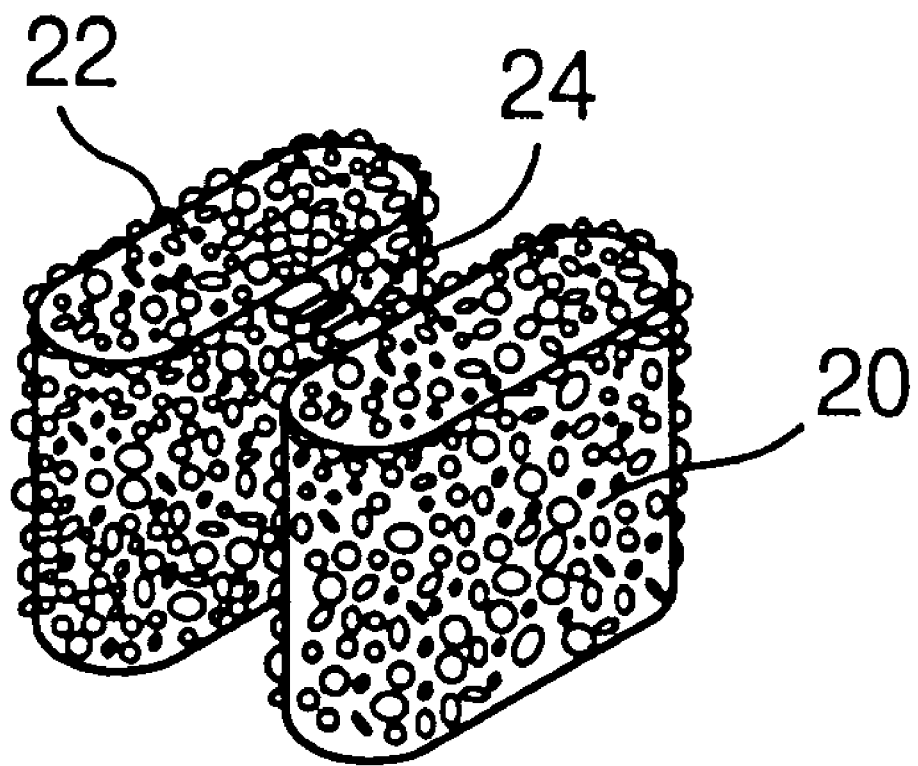
FIG. 2C is an enlarged perspective view of the two adjacent DRAM cell capacitors that are indicated by a dotted circle in FIG. 2B.
Figure 3A:
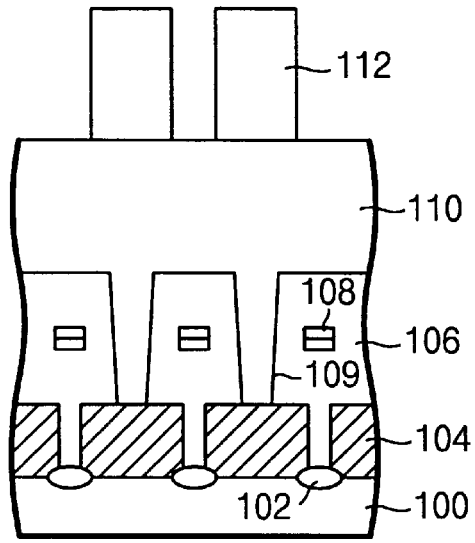
FIGS. 3A to 3D are flow diagrams showing the process steps of a novel method for manufacturing a DRAM cell capacitor having an angled shape at its top edges according to a preferred embodiment of the present invention.
Figure 3B:
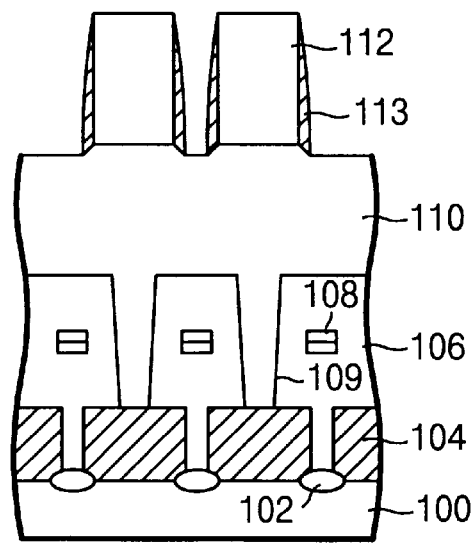
Figure 3C:
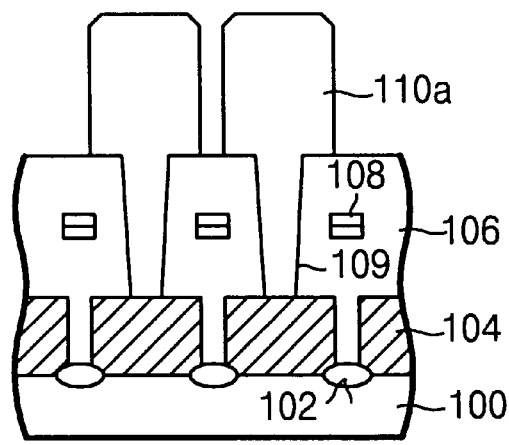
Figure 3D:
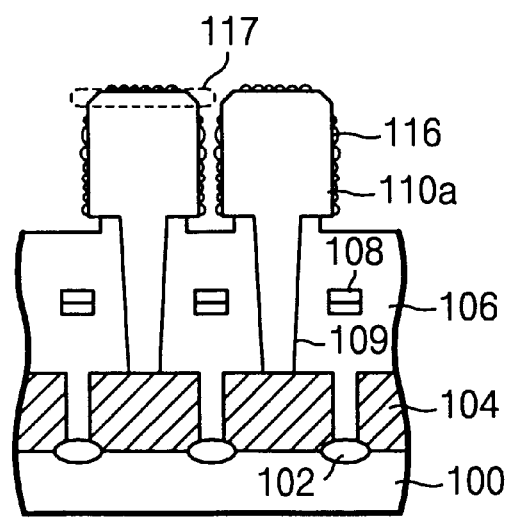

Referring to FIG. 3D, a novel method for manufacturing a DRAM cell capacitor in accordance with a preferred embodiment of the present invention comprises the process steps to form a capacitor bottom electrode 110a on an interlayer insulating layer 106 by selectively etching a conductive layer 110 used for storage electrode and to form an HSG silicon layer 116 on a surface of the capacitor bottom electrode 110a so as to increase the capacitance of the capacitor. The capacitor bottom electrode 110a has a rugged surface because of the HSG silicon layer 116. When the HSG silicon layer 116 is formed on the capacitor bottom electrode 110a which has an angled (slanting or rounding) shape at its top edges, it is not formed on the top edges. It is a key feature of the present invention that the HSG silicon layer 116 is not formed on the top edges of the capacitor bottom electrode 110a to thereby generate a short-circuit between adjacent capacitor bottom electrodes. As a result, failure of DRAM devices can be reduced.

Figure 4:
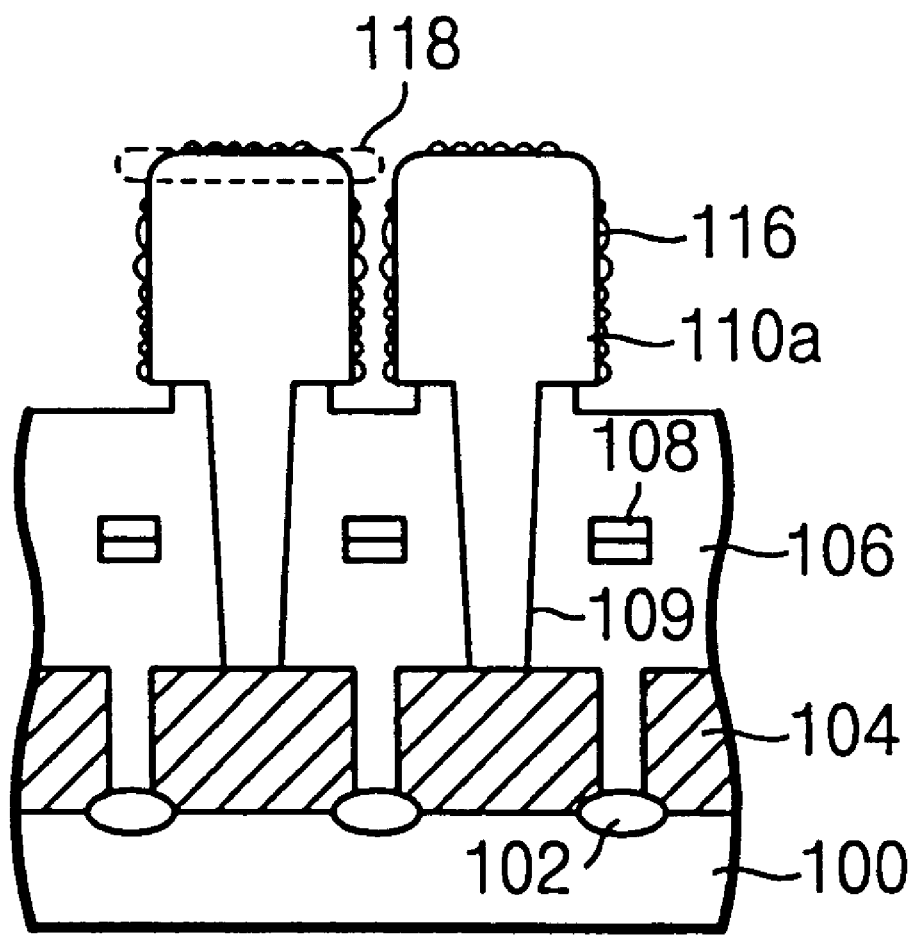
FIG. 4 is a cross-sectional view of the DRAM cell capacitor having a rounding shape at its top edges according to a variation of the preferred embodiment of the present invention.

In this embodiment of the invention, the top edge portion 117 of the capacitor bottom electrode used for storage node has a slanting shape as shown in FIG. 3D, while in a variation of the embodiment, the top edge portion (indicated by a reference numeral 118 in FIG. 4) thereof has a rounding shape.

Hereinafter, a method for manufacturing the DRAM cell capacitor mentioned above will be described in detail with reference to FIGS. 3A through 3D.

Referring to FIG. 3A, a semiconductor substrate 100, (preferably a silicon substrate) has had device isolation regions 102 (preferably field oxide regions) patterned to define active and inactive regions. A pad electrode 104 (preferably polysilicon) is formed on the active region and then an interlayer insulating layer 106 is formed over the field oxide region 102 including the pad electrode 104. In the embodiment shown in FIG. 3A, a bit line electrode 108 is formed within the interlayer insulating layer 106.

By etching the interlayer insulating layer 106 until an upper surface of the pad electrode 104 is exposed, a buried contact hole 109 is then formed. Next, a conductive layer 110 (preferably polysilicon) for use as a storage electrode is deposited over the interlayer insulating layer 106 to fill up the buried contact hole 109. The conductive layer 110 preferably has a thickness of about 9000 Å.

A photoresist layer 112 is then formed and patterned over the conductive layer 110 to define a capacitor storage electrode. Using the patterned photoresist layer 112 as a mask, an etching process is performed to remove the conductive layer 110 to a thickness in the range of about 50 Å to 2000 Å. This etching process uses an etchant containing a fluorine gas, (e.g., a mixture of $CHF_3$ and argon (Ar) gases). In this embodiment, the etching process is performed using M×P etching equipment of AMT Co., Ltd. under the conditions that an inner pressure of the process chamber is about 100 mtorr, power is about 300 Watt, a magnetic field is about 15 Gauss, a flow of $CHF_3$ gas is about 60 sccm, and a flow of argon gas is about 20 sccm.

With reference to FIG. 3B, the conductive layer 110 is angled at the bottom edges of the patterned photoresist layer 112, because, during the etching process, a polymer 113 is formed on both sidewalls of the patterned photoresist layer 112. We should give attention to the fact that the top edges of the conductive layer 110 are angled (formed slantingly or roundly) by slantingly etching the conductive layer 110 at the bottom edges of the patterned photoresist layer 112. Actually, it can be seen from FIGS. 3C and 3D that the conductive layer 110 is formed having only a slanting shape at its top edges. From FIG. 4, it can be seen that the conductive layer 110 is formed having a rounding shape at its top edges.

As shown in FIG. 3C, an etching process of the remaining conductive layer 110 is gain performed using a combination of the patterned photoresist layer 112 and the polymer 113 as a mask until an upper surface of the interlayer insulating layer 106 is exposed, and thereby a capacitor storage electrode 110a is formed. The etching process is preferably performed using tcp etching equipment of LRC Co., Ltd. under the conditions that an inner pressure of the process chamber is about 5 mtorr, a source power is about 600 Watt, a low power is about 50 Watt, a flow of $Cl_2$ gas is about 40 sccm, a flow of $SF_6$ gas is about 5 sccm, and a flow of $N_2$ gas is about 6 sccm. Alternatively, the etching process may be performed using M×P etching equipment of AMT Co., Ltd. under the conditions that an inner pressure of the process chamber is about 120 mtorr, a power is about 450 Watt, a magnetic field is about 40 Gauss, a flow of HBr gas is about 60 sccm, and a flow of $Cl_2$ gas is about 20 seem.

After removing the photoresist layer 112 and the polymer 113 using an ashing or $H_2SO_4$ stripping process that is well-known in this art, the substrate is washed by dipping it in a washing liquid, such as a mixture of $NH_3$, $H_2O_2$, and deionized water (i.e., the sc1 solution).

Finally, as shown in FIG. 3D, an HSG (Hemi-Spherical Grain) forming process well-known in the art is performed to obtain a wider effective surface area of the capacitor storage electrode 110a. As a result, an HSG silicon layer 116 formed on the capacitor storage electrode 110a has an unevenness or roughness formed on its surface. It is an important feature of the present invention that, during the HSG forming process, the HSG silicon layer 116 is not formed on the top edges of the capacitor storage electrode 110a which are formed roundly or slantingly.

Subsequently, a part of the interlayer insulating layer 106 that is at the bottom of the capacitor storage electrode 110a is removed by etching, thereby increasing the effective surface area of the capacitor storage electrode 110a, as shown in FIG. 3D. The etching of the interlayer insulating layer 106 is preferably performed using washing liquid which is a mixture of the La1 solution and the sc1 solution. Alternatively the etching of the interlayer insulating layer 106 can be performed using only the La1 solution.

Next, after the semiconductor substrate wherein the HSG silicon layer 116 is formed is washed by using the washing liquid, for example, sc1 and HF solution, or HF solution only, a capacitor dielectric layer (not shown) such as oxide, nitride or the like is formed. Also, a capacitor top electrode (not shown) is formed over the capacitor dielectric layer. As a result, the DRAM cell capacitor is completely fabricated.

As mentioned immediately above, because the etching and washing process does not use the sc1 solution, the HSG silicon layer 116 can be prevented from being lifted on the capacitor storage electrode 110a.

Figure 5:
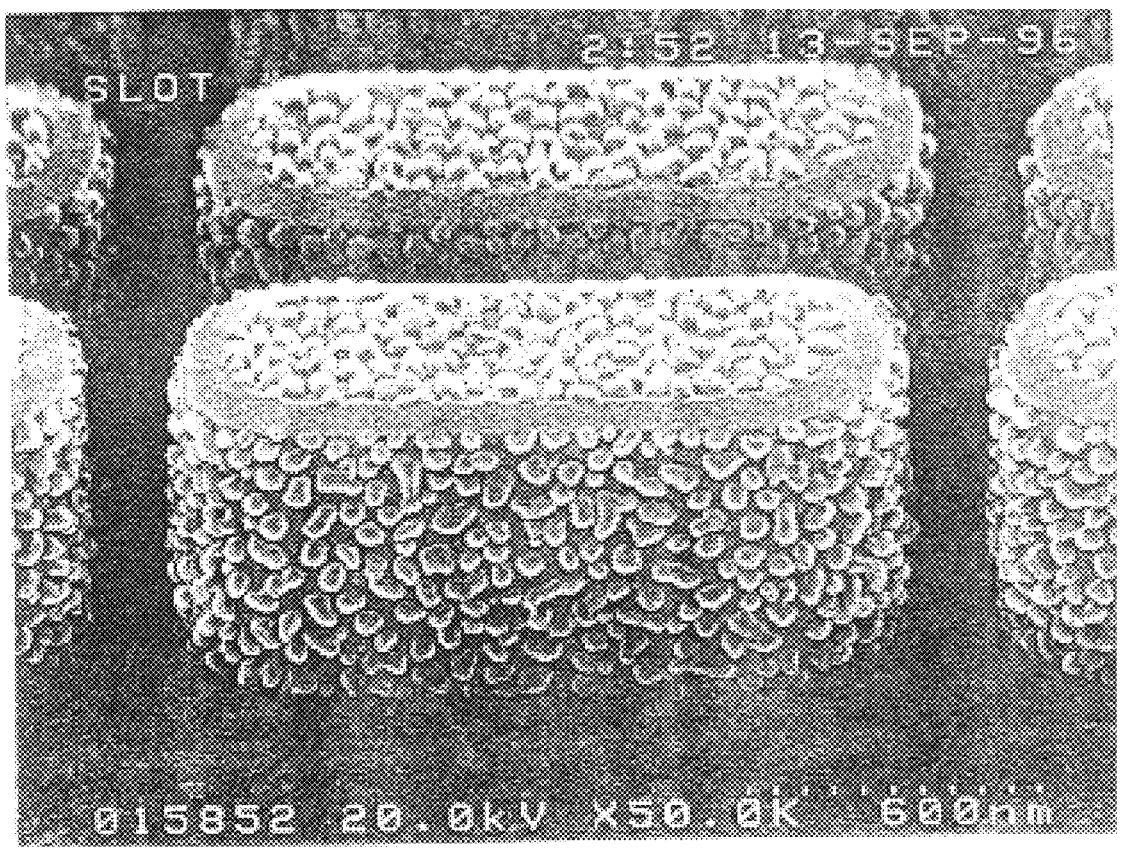
FIG. 5 is a SEM that illustrates the top edges of the capacitor storage electrode that is manufactured according to the novel method of the present invention.

FIG. 5 shows a scanning electron microphotograph (SEM) that illustrates the top edges of the capacitor storage electrode that is manufactured according to the preferred embodiment of the present invention.

Referring to FIG. 5, although a part of the HSG silicon layer 116 is lifted from the surfaces of the capacitor storage electrode 110a during the etching and washing process, a short-circuit between the capacitor storage electrodes which has been frequently generated by the HSG silicon layer lifted from the top edges of the capacitor storage electrode can be prevented. This is because the HSG silicon layer 116 is not formed on the top edges of the capacitor storage electrode 110a which have the angled (slanting or rounding) shape.

Figure 6:
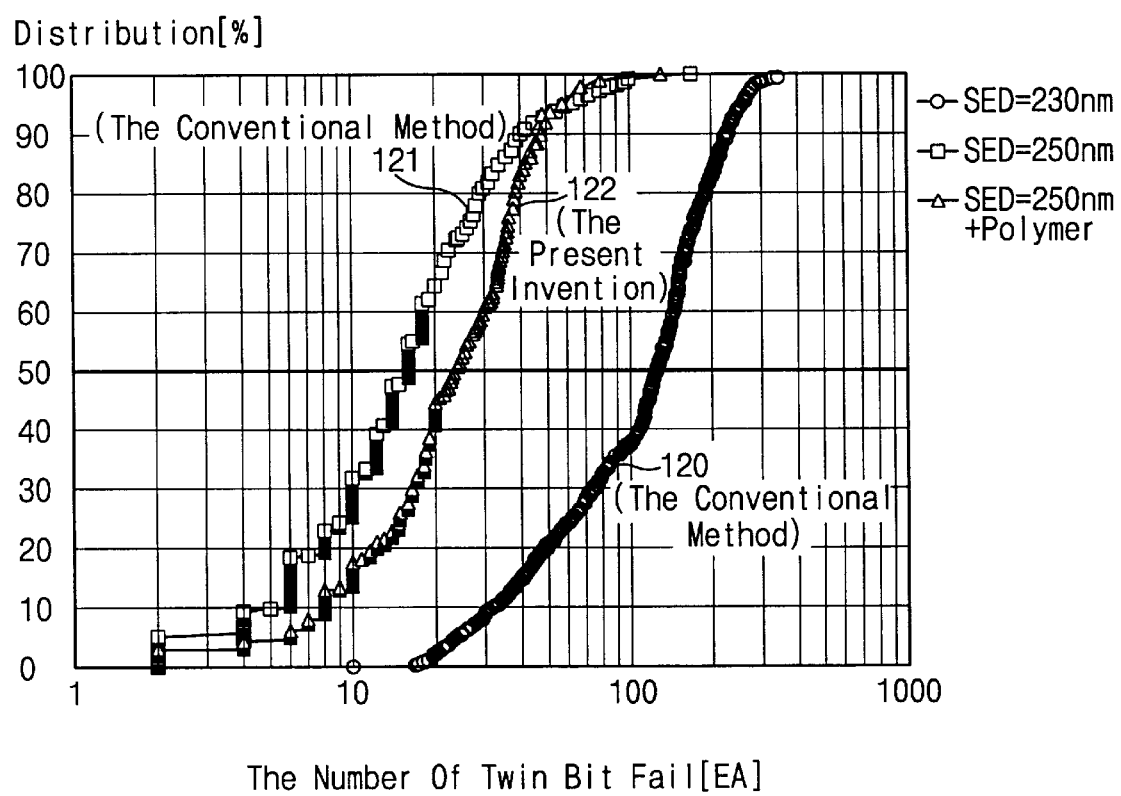
FIG. 6 is a graph showing the distribution of the number of twin-bit fail occurring between capacitor storage electrodes.
Figure 7:
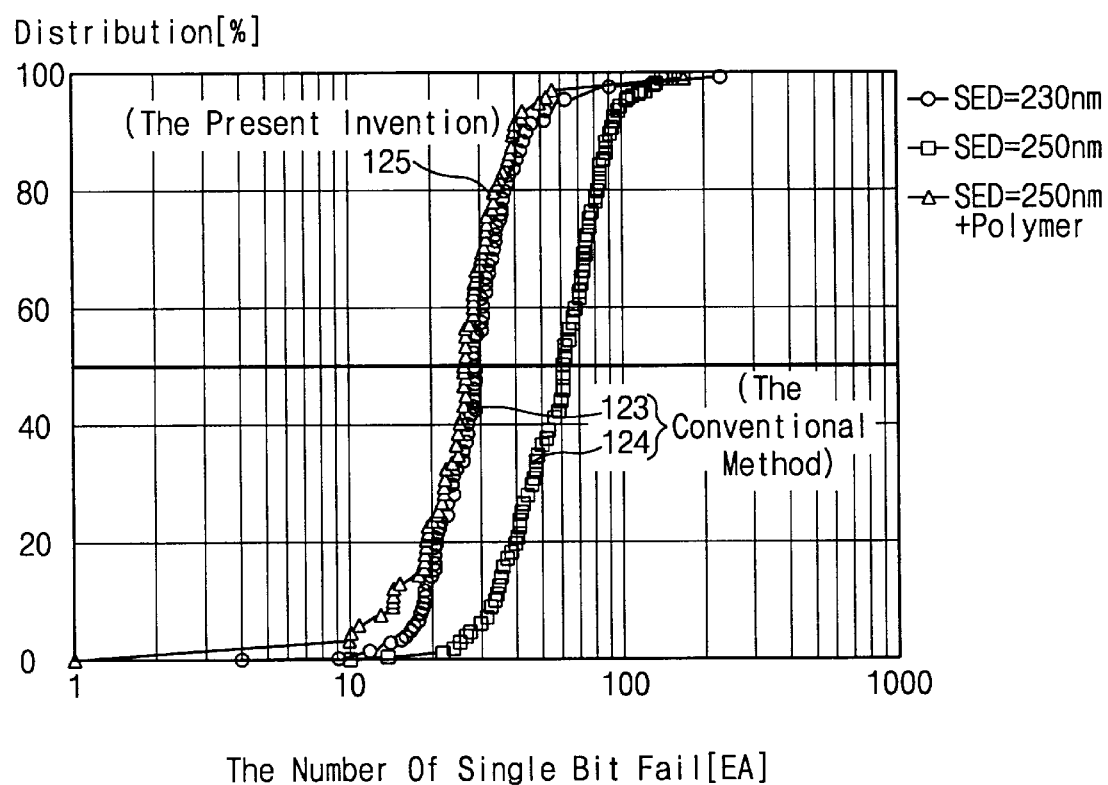
FIG. 7 is a graph showing the distribution of the number of single-bit fail occurring at a single capacitor storage electrode.

FIG. 6 is a graph showing the distribution of the number of twin-bit failures occurring between the capacitor storage electrodes. FIG. 7 is a graph showing the distribution of the number of single-bit failures occurring at a single capacitor storage electrode.

Referring to FIG. 6, reference numerals 120 and 121 are distribution curves of the twin-bit failures in case that a distance SED between two adjacent capacitor storage electrodes fabricated according to the conventional method is 230 nanometers and 250 nanometers, respectively, and a reference numeral 122 is a distribution curve of the twin-bit fail in case that a distance SED between two adjacent capacitor storage electrodes fabricated according to the novel method of the present invention is 250 nanometers. It can be seen from the distribution curves 120, 121 and 122 that the number of twin-bit fails with respect to the average distribution (distribution of 50% in FIG. 6) is about one hundred five, about fifteen and twenty five, respectively for these curves. however, the distance SED between two adjacent capacitor storage electrodes of the present invention is actually decreased to less thin about 230 nanometers because of the polymer 113 (referred to FIG. 3B) formed on both sidewalls of the patterned photoresist layer 112. Therefore, the results obtained according to the novel method of the present invention is similar to the fail number in case of the distance of 250 nanometers in the conventional method, but respectively very smell as compared to that in case of the distance of 230 nanometers in the conventional method.

As shown in FIG. 7, reference numerals 123 and 124 are distribution curves of the twin-bit fail in case that a distance between two adjacent capacitor storage electrodes fabricated according to the conventional method is 230 nanometers and 250 nanometers, respectively, and a reference numeral 125 is a distribution curve of the twin-bit fail in case that a distance between two adjacent capacitor storage electrodes fabricated according to the novel method of the present invention is 250 nanometers. It can be seen from the distribution curves 123, 124, and 125 that the number of single-bit fails with respect to the average distribution (distribution of 50% in FIG. 7) is about thirty, about sixty, and about twenty eight, respectively for these curves. As can be seen herein, the number of single-bit fails according to the present invention is most small as compared to those in the conventional method.

Thus, the present invention provides the advantage of capacitor storage electrodes, but can prevent them from being short-circuited due to some HSG lifted from top edges of them during etching and washing process after formation of HSG.

It is apparent that the present invention is not limited to the above embodiment but may be modified and changed without departing from the scope and sprit of the invention.

What is claimed is:

1. A method for manufacturing a DRAM cell capacitor, comprising the steps of:

forming a field oxide layer over a semiconductor substrate to define active and inactive regions;

forming a pad electrode over the active region;

forming an interlayer insulating layer over the pad electrode and the field oxide layer;

forming a contact hole in the interlayer insulating layer to expose the pad electrode;

forming a conductive layer over interlayer insulating layer and filling up the contact hole;

forming a photoresist pattern over the conductive layer to define a capacitor bottom electrode;

simultaneously etching an upper portion of the conductive layer using the photoresist pattern as a mask, and forming a polymer on sidewalls of the photoresist pattern to etch the upper portion of the conductive layer and to thereby angle a top edge of the conductive layer;

etching a remaining portion of the conductive layer using a combination of the photoresist pattern and the polymer as a mask until an upper surface of the interlayer insulating layer is exposed, to thereby form the capacitor bottom electrode having a top surface, one or more sidewalls, and the top edge formed between the top surface and the one or more sidewalls;

removing the photoresist pattern and the polymer;

forming an HSG silicon layer on the capacitor bottom electrode in order that the capacitor bottom electrode has a rugged surface, wherein the HSG silicon layer is formed only on the top surface and the one or more sidewalls of the capacitor bottom electrode;

forming a capacitor dielectric layer over the capacitor bottom electrode; and forming a capacitor top electrode over the capacitor dielectric layer.

2. A method for manufacturing a DRAM cell capacitor as recited in claim 1, wherein the top edge of the conductive layer is formed to have a slated shape.

3. A method for manufacturing a DRAM cell capacitor as recited in claim 1, wherein the top edge of the conductive layer is formed to have a rounded shape.

4. A method for manufacturing a DRAM cell capacitor as recited in claim 1, wherein the conductive layer has a thickness of about 9000 Å, and the upper portion of the conductive layer has a thickness in the range of 50 Å to 200 Å.

5. A method for manufacturing a DRAM cell capacitor as recited in claim 1, wherein the step of etching the upper portion of the conductive layer uses a mixture of $CHF_3$ and Ar gases as an etchant.

6. A method for manufacturing a DRAM cell capacitor as recited in claim 1, wherein the step of etching the remaining portion of the conductive layer uses a material selected from a group consisting of a mixture of $Cl_2$, $SF_6$, and $N_2$ gases, and a mixture of HBr and $Cl_2$ gases.

7. A method for manufacturing a DRAM cell capacitor as recited in claim 1, wherein the method further comprises the steps of etching an upper portion of the interlayer insulating layer so as to expose a lower surface of the conductive layer; and washing the semiconductor substrate.

8. A method for manufacturing a DRAM cell capacitor as recited in claim 7, wherein the step of etching the upper portion of the interlayer insulating layer uses a washing liquid that includes a mixture of $NH_4F$ and HF, and a mixture of $NH_3$, $H_2O_2$, and deionized water.

9. A method for manufacturing a DRAM cell capacitor as recited in claim 7, wherein the step of etching the upper portion of the interlayer insulating layer uses a washing liquid that includes a mixture of $NH_4F$ and HF.

10. A method for manufacturing a DRAM cell capacitor as recited in claim 7, wherein the step of washing the semiconductor substrate uses a washing liquid that includes a mixture of $NH_3$, $H_2O_2$, deionized water and HF solution.

11. A method for manufacturing a DRAM cell capacitor as recited in claim 7, wherein the step of washing the semiconductor substrate uses a washing liquid that includes an HF solution.

12. A method for manufacturing a DRAM cell capacitor as recited in claim 1, wherein the method further comprises the step, performed after the step of forming the HSG silicon layer, of washing the semiconductor substrate using a washing liquid including a fluorine solution.

13. A method for manufacturing a DRAM cell capacitor as recited in claim 12, wherein the washing liquid is in HF solution.

14. A method for manufacturing a DRAM cell capacitor as recited in claim 1, wherein the step of forming a contact hole is performed by selectively etching the interlayer insulating layer to expose the pad electrode.

15. A method for manufacturing a DRAM cell capacitor as recited in claim 1, wherein a bit line is formed within the interlayer insulating layer.

* * * * *